(12) United States Patent
Park et al.

(10) Patent No.: US 8,659,098 B2
(45) Date of Patent: Feb. 25, 2014

(54) RESONATOR AND FABRICATION METHOD THEREOF

(75) Inventors: Yun-Kwon Park, Dongducheon-si (KR); Byeoung-Ju Ha, Seongnam-si (KR); Byeong-Kwon Ju, Seoul (KR); Jae-Sung Rieh, Seoul (KR); In-Sang Song, Seoul (KR); Jin-Woo Lee, Seoul (KR); Jea-Shik Shin, Hwaseong-si (KR); Young-Min Park, Seoul (KR)

(73) Assignees: Samsung Electronics Co., Ltd., Suwon-si (KR); Korea University Industrial and Academic Collaboration Foundation, Seoul (KR)

( * ) Notice: Subject to any disclaimer, the term of this patent is extended or adjusted under 35 U.S.C. 154(b) by 784 days.

(21) Appl. No.: 12/388,157

(22) Filed: Feb. 18, 2009

(65) Prior Publication Data
US 2009/0267706 A1    Oct. 29, 2009

(30) Foreign Application Priority Data
Apr. 28, 2008  (KR) .................. 10-2008-0039469

(51) Int. Cl.
*H01L 29/84* (2006.01)
(52) U.S. Cl.
USPC .............................. 257/415; 438/50; 977/887

(58) Field of Classification Search
USPC ................ 257/415–420; 977/887; 438/50–53
See application file for complete search history.

(56) References Cited

U.S. PATENT DOCUMENTS

| | | | | |
|---|---|---|---|---|
| 5,772,905 A * | 6/1998 | Chou | ............................... | 216/44 |
| 6,803,840 B2 * | 10/2004 | Kowalcyk et al. | ............ | 333/186 |
| 6,821,911 B1 * | 11/2004 | Lo et al. | ......................... | 438/780 |
| 7,518,283 B2 * | 4/2009 | Pinkerton et al. | ............. | 310/309 |
| 2006/0255834 A1 * | 11/2006 | Bertin | ............................. | 326/56 |
| 2007/0157873 A1 * | 7/2007 | Hauptmann et al. | ............ | 117/87 |
| 2008/0233744 A1 * | 9/2008 | Kaul et al. | .................... | 438/684 |
| 2010/0214034 A1 * | 8/2010 | Peng et al. | .................... | 331/154 |

OTHER PUBLICATIONS

Harish M. Manohara, Eric W. Wong, Erich Schlecht, Brian D. Hunt, and Peter H. Siegel, Carbon Nanotube Schottky Diodes Using Ti—Schottky and Pt—Ohmic Contacts for High Frequency Applications, Nano Lett., 2005, 5 (7), pp. 1469-1474.*

* cited by examiner

*Primary Examiner* — Mark Tornow
(74) *Attorney, Agent, or Firm* — NSIP Law (57) ABSTRACT

A resonator fabrication method is provided. A method includes providing a plurality of electrode patterns disposed apart from each other on a substrate using a nano-imprint technique; and forming an extended electrode pattern connected to a plurality of electrode patterns, and forming a nano structure laid across an extended electrode patterns. Therefore, a nano-electromechanical system (NEMS) resonator is easily fabricated at a nanometer level.

14 Claims, 13 Drawing Sheets

RESONATOR AND FABRICATION METHOD THEREOF

CROSS-REFERENCE TO RELATED APPLICATIONS

This application claims priority under 35 U.S.C. §119 from Korean Patent Application No. 10-2008-0039469, filed on Apr. 28, 2008, in the Korean Intellectual Property Office, the disclosure of which is incorporated herein by reference in its entirety.

BACKGROUND OF THE INVENTION

1. Field of the Invention

The present invention relates to a resonator and a fabrication method thereof, and more particularly to a nano-electromechanical system (NEMS) resonator which is fabricated using nanotechnology, and a fabrication method thereof.

2. Description of the Related Art

With the advancement of electronic technologies, microminiaturization of various portable devices has become widespread. To fabricate micro-miniature devices, it is required that the components mounted therein should also be miniaturized.

Micro-electromechanical system (MEMS) technology, which enables devices or equipment having a microstructure on a scale of less than a few micrometers to be designed, and nano-electromechanical system (NEMS) technology, which enables devices or equipment having an ultra-microstructure on a scale of less than a few nano-meters to be designed, are increasingly used to develop microminiature and ultra light devices.

NEMS is an electrodynamics system to convert an electronic signal to a dynamic motion, and vice versa.

A micro-miniature resonator fabricated using MEMS or NEMS technology may be used as a component of a filter or duplexer of a portable communication device to perform radio frequency (RF) communication.

The size of a resonator, the operating temperature, and the quality (Q) factor are used to determine the performance of a resonator. The Q factor indicates the quality of frequency selectivity, a higher Q factor enabling a higher performance to be achieved. The larger the resonator and the lower the temperature are provided, Q factor is higher.

If the resonator embodied with the micro-technology is operated at low temperature, a Q factor of more than 10,000 is acquired. However, the resonator should be operated at room temperature, and the resonator is required to be small in order to have a bandwidth of GHz. When a conventional resonator fabricated with the micro-technology is used, the bandwidth of the resonator is within a range of hundreds of MHz, and the Q factor is rarely as high.

The resonator has been developed using nanotechnology, but there are problems, in that it is difficult to handle and dispose of nano-materials and that the reproducibility is poor.

SUMMARY OF THE INVENTION

Exemplary embodiments of the present invention address at least the above problems and/or disadvantages and other disadvantages not described above. Also, the present invention is not required to overcome the disadvantages described above, and an exemplary embodiment of the present invention may not overcome any of the problems described above.

The present invention provides a resonator fabrication method to easily fabricate a resonator using nanotechnology, and also provides a resonator fabricated according to the method.

According to an exemplary aspect of the present invention, there is provided a resonator fabrication method, including (a) providing a plurality of electrode patterns disposed apart from each other on a substrate using a nano-imprint technique; and (b) forming an extended electrode pattern connected to the plurality of electrode patterns, and forming a nano structure laid across the extended electrode patterns.

Step (a) may include forming the plurality of electrode patterns disposed apart from each other by forming a photo resist pattern on a surface of the substrate, covering the surface with metal, and removing the photo resist pattern from the surface; coating a resin layer on the electrode pattern; and arranging a prepared nano-imprint stamp on the substrate, and removing at least one part of the resin layer by performing the nano-imprint.

Step (b) may include forming the plurality of extended electrode patterns connected to the plurality of electrode patterns by exposing the substrate removing the part of the resin layer, and metallizing the exposed substrate; forming a first coating layer connecting the plurality of extended electrode patterns; forming a second coating layer over the whole area excluding the first coating layer; and forming the nano structure laid across the extended electrode patterns by deposing a nano material on the first coating layer and the second coating layer, and removing the second coating layer and the nano material on the second coating layer.

The operation of forming the first coating layer may include using a photolithographic technique or a soft lithographic technique.

The first coating layer may be made of a 3-aminopropylitriethoxysilane (3-APS) polymer material, and the second coating layer may be made of an octadecyltrichlorosilane (OTS) polymer material.

Step (a) may proceed at a micrometer level, and step (b) may proceed at a nanometer level.

The plurality of electrode patterns may be formed at a micrometer level, and the plurality of extended electrode patterns may be formed at a nanometer level.

The nano structure may include one of a carbon nano tube, an oxide nano wire, and a polymer nano fiber.

The method may further include fixing the nano structure on the plurality of extended electrode patterns.

The fixing may include additionally coating a resin layer; removing part of the additionally coated resin layer using the nano-imprint technique; and additionally forming a fixed electrode to fix the nano structure to the plurality of extended electrode patterns by metallizing the part from which the resin layer is removed, and removing the additionally coated resin layer.

According to an exemplary aspect of the present invention, there is provided a resonator including a plurality of electrode patterns which are disposed apart from each other on a substrate, and are formed at a micrometer level; and a plurality of extended electrode patterns which are connected to the plurality of electrode patterns, and are formed at a nanometer lever; and a nano structure which is laid across the plurality of extended electrode patterns, and is disposed apart from a surface of the substrate to resonate.

The resonator may further include a fixed electrode which fixes the nano structure on the extended electrode pattern.

The nano structure may include one of a carbon nano tube, an oxide nano wire, and a polymer nano fiber.

The resonator may further include an oxide layer and a silicon layer which are sequentially disposed between the plurality of electrode patterns and the surface of the substrate, and provide a space in which the nano structure resonates.

BRIEF DESCRIPTION OF THE DRAWINGS

The above and/or other aspects of the present invention will be more apparent by describing certain exemplary embodiments of the present invention with reference to the accompanying drawings, in which.

DETAILED DESCRIPTION OF EXEMPLARY EMBODIMENTS OF THE INVENTION

Certain exemplary embodiments of the present invention will now be described in greater detail with reference to the accompanying drawings.

In the following description, the same drawing reference numerals are used for the same elements even in different drawings. The matters defined in the description, such as detailed construction and elements, are provided to assist in a comprehensive understanding of the invention. However, the present invention can be carried out without those specifically defined matters. Also, well-known functions or constructions are not described in detail since they would obscure the invention with unnecessary detail.

A resonator fabrication method according to an exemplary embodiment of the present invention may include a process of forming a plurality of electrode patterns which are disposed apart from each other on a substrate, and a process of producing an extended electrode pattern connected to the respective electrode patterns and a nano structure interposed between the extended electrode patterns. The electrode pattern may be fabricated at a micrometer level, and the extended electrode pattern and the nano structure may be fabricated at a nanometer level.

FIGS. 1A to 1F are sectional views illustrating the process of forming an electrode pattern in a resonator fabrication method according to an exemplary embodiment of the present invention.

Figure 1A:
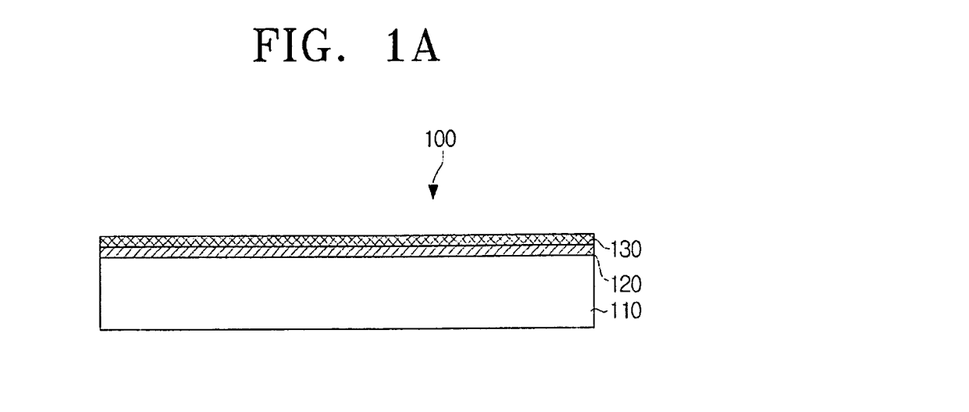
FIGS. 1A to 1F are sectional views illustrating the process of forming an electrode pattern in a resonator fabrication method according to an exemplary embodiment of the present invention.

Referring to FIG. 1A, a substrate 100 is provided. The substrate may be a silicon-on-insulator (SOI) substrate which is formed by sequentially laying a silicon substrate 110, an oxide layer 120, and a silicon film 130. A SOI substrate is advantageous, because it has strong adhesion between the oxide layer 120 and the silicon film 130, good electric conductibility and thermal conductibility are exhibited on the silicon film 130, and the materials of each layer are evenly dispersed over the whole surface of the layers.

The SOI substrate may be fabricated by disposing an oxide layer and a silicon oxide layer on a conventional silicon substrate in order to reduce fabricating costs.

Figure 1B:
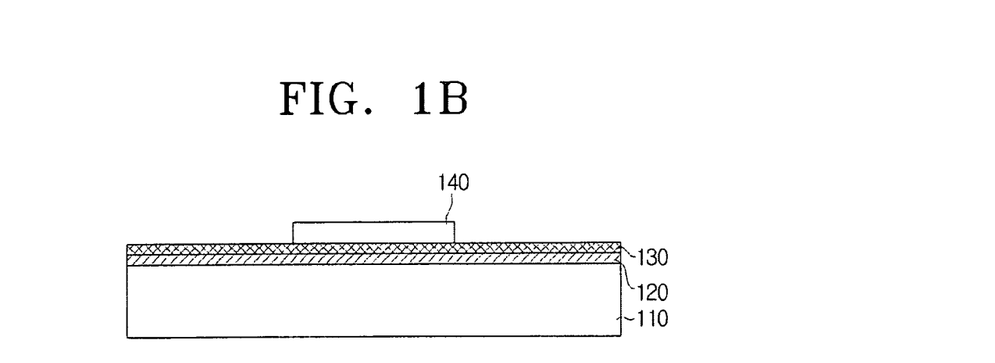

Referring to FIG. 1B, a photo resist pattern 140 is formed by coating a photo resist on a substrate, and applying a photolithographic technique to the substrate. For example, the photo resist is coated over the whole surface of the substrate, a position to form an electrode pattern is set using a photo mask, ultraviolet (UV) lithography is performed to set an area to etch a photo resist, and etching is executed on the area excluding the photo resist pattern 140 as shown in FIG. 1B.

Figure 1C:
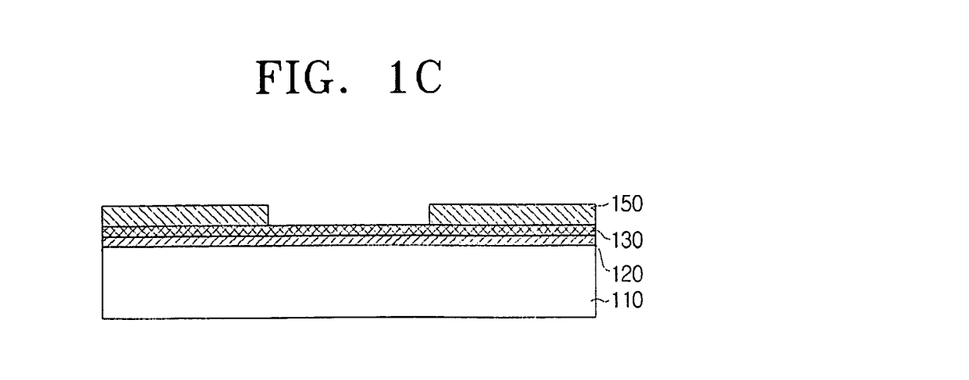

The whole surface of the patterns formed according to the above processes is metallized, and the photo resist pattern 140 is removed using lift-off process so as to form the plurality of electrode patterns 150 as shown in FIG. 1C. The electrode patterns 150 are spaced apart from each other at a predetermined distance on the substrate 100.

While the process of forming the electrode pattern 150 using the photo lithographic technique is explained with reference to FIGS. 1B and 1C, a soft lithographic technique may alternatively be used to form the electrode pattern 150.

Figure 1D:
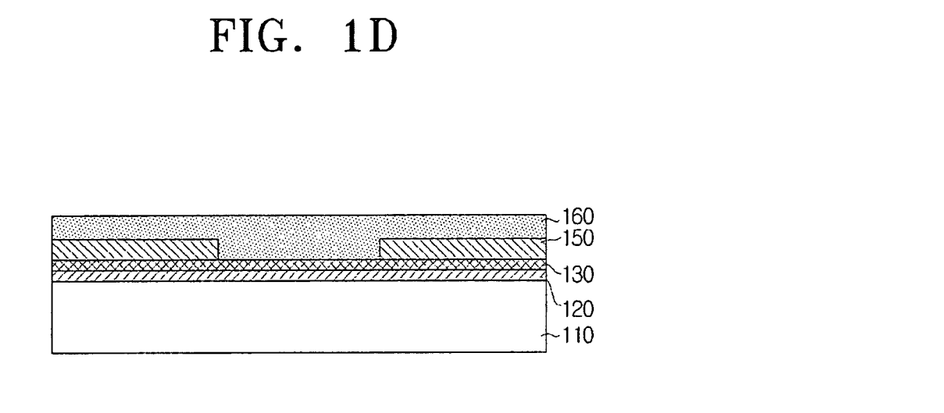

Referring to FIG. 1D, a resin layer 160 is coated on the whole surface of the substrate 100 on which the electrode patterns 150 are formed.

A space to form the extended electrode pattern using the nano-imprint technique is set.

Figure 1E:
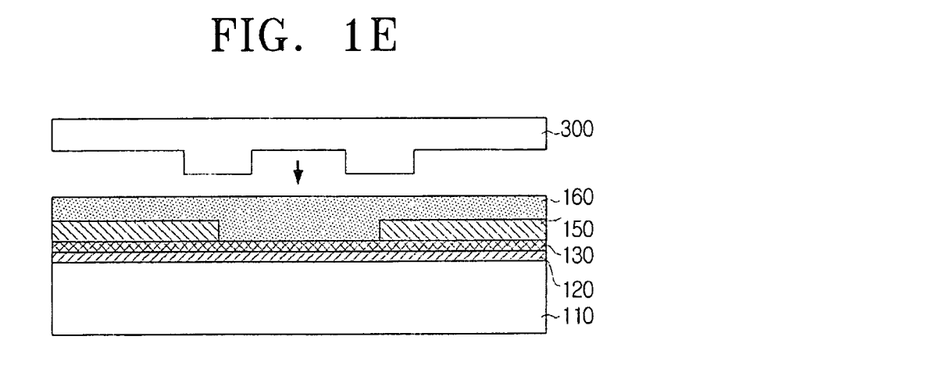

A nano-imprint stamp 300 which is pre-provided and the substrate 100 on which the resin layer 160 is coated are arranged as shown in FIG. 1E. As a nano-imprint stamp 300 is used, the arrangement of the substrate can be performed conveniently. Accordingly, the position on which the extended electrode pattern is formed may be precisely controlled to the nanometer level. If the arrangement of the nano-imprint stamp 300 and the substrate 100 are completed, the nano-imprint is performed as indicated by the arrow. The temperature and pressure required when the nanoimprint is performed may be determined according to the type of resin layer 160.

Figure 1F:
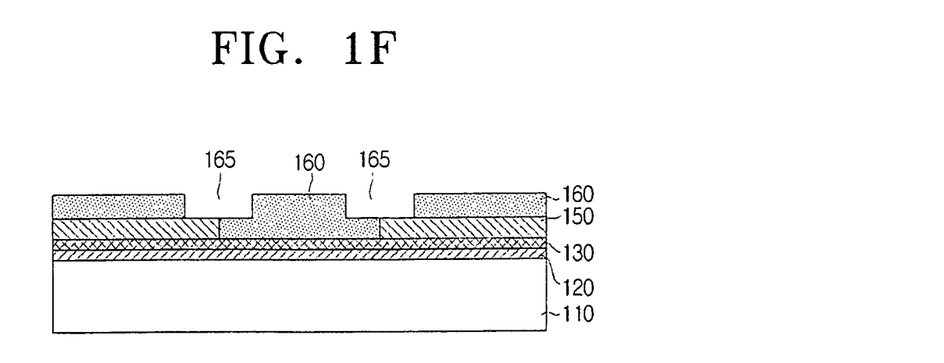

Part of the resin layer 160 is removed, and an area 165 to form the extended electrode pattern is provided as shown in FIG. 1F.

Figure 2A:
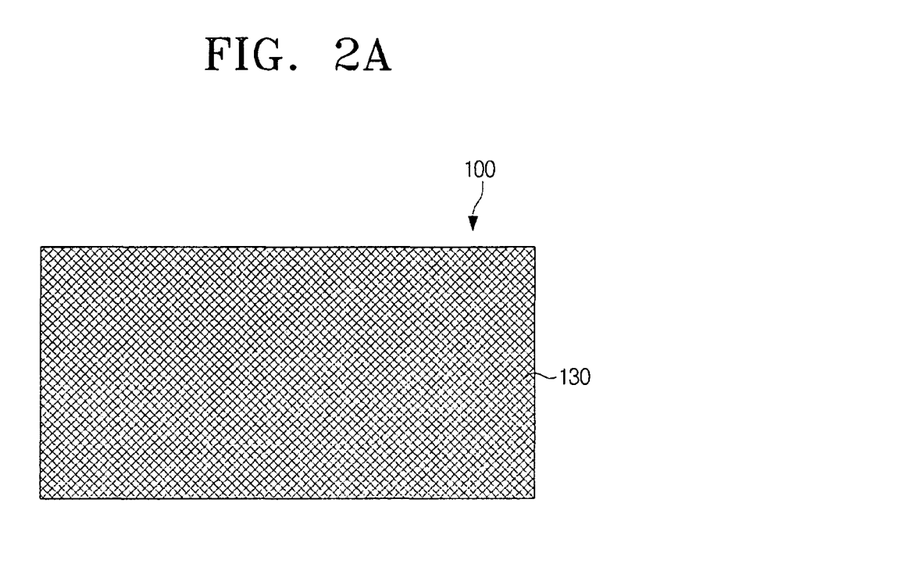
FIGS. 2A to 2E are plan views corresponding to FIGS. 1A to 1F.
Figure 2B:
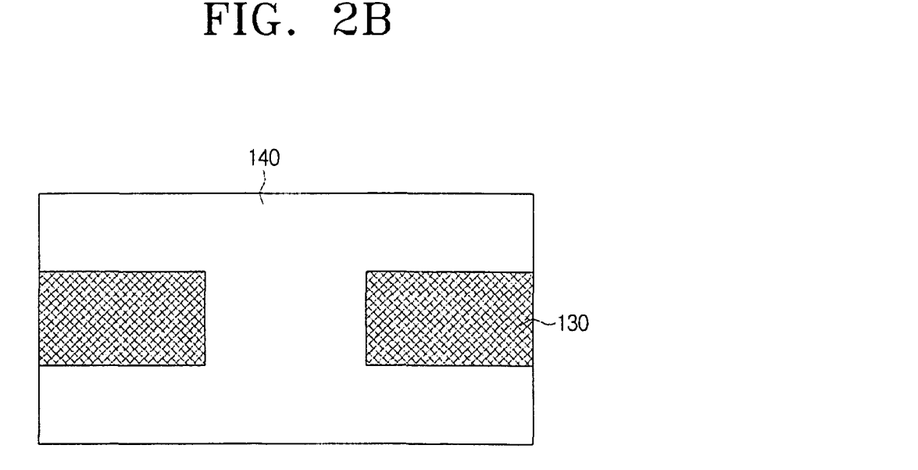

FIGS. 2A to 2E are plan views corresponding to FIGS. 1A to 1F. If the substrate 100 on which the silicon film 130 is coated is provided as shown in FIG. 2A, the photo resist pattern 140 is formed as shown in FIG. 2B.

Figure 2C:
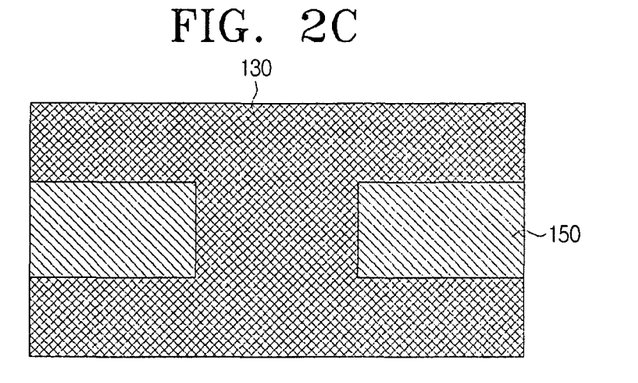

Referring to FIG. 2C, the plurality of electrode patterns 150 are formed by retaining metal material on the area excluding the photo resist pattern 140.

Figure 2D:
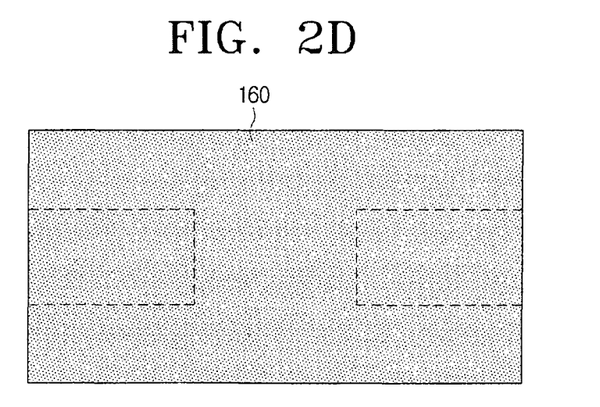
Figure 2E:
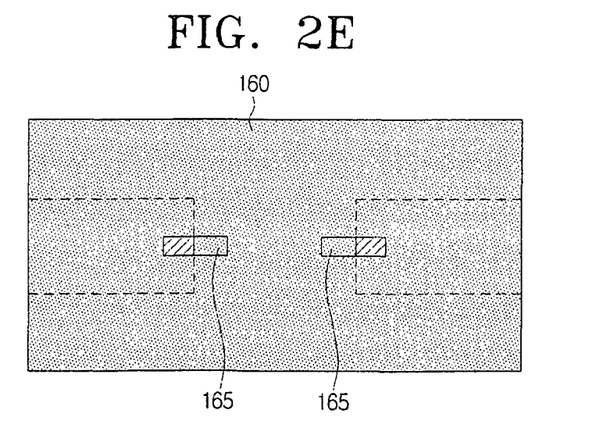

Referring to FIG. 2D, the resin layer 160 is coated over the whole surface of the substrate 100, and an area to form the extended electrode pattern using the nano-imprint technique is determined.

The processes illustrated in FIGS. 1A to 1F and 2A to 2E are performed at the micrometer level. Accordingly, the electrode pattern 150 may be formed at a micrometer level, and may be made of gold, silver, or platinum.

FIGS. 3A to 3G are sectional views illustrating the process of producing an extended electrode pattern and a nano structure using a resonator fabrication method according to an exemplary embodiment of the present invention.

Figure 3A:
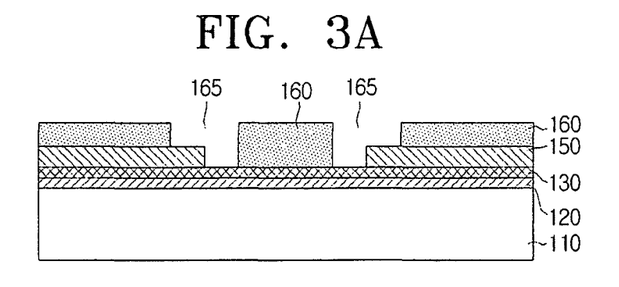
FIGS. 3A to 3G are sectional views illustrating the process of producing an extended electrode pattern and a nano structure using a resonator fabrication method according to an exemplary embodiment of the present invention.

Referring to FIG. 3A, the resin material remaining in the area 165 after the nano-imprint is processed is removed by the reactive ion etching (RIE).

Figure 3B:
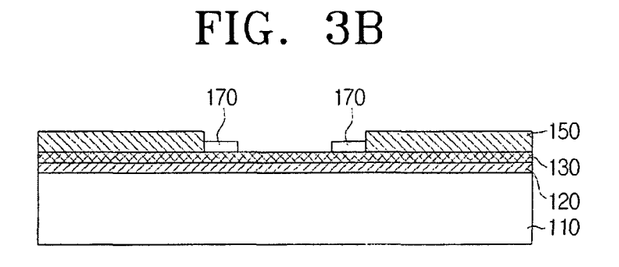

After the whole surface of the substrate 100 is metallized, the remaining resin layer 160 is removed by the lift-off processing, so that the extended electrode pattern 170 is formed as shown in FIG. 3B. The respective extended electrode patterns 170 are disposed between the electrode patterns 150, and spaced apart from each other. The metal processing is executed at a nanometer level, and the extended electrode pattern 170 is formed at a nanometer level.

Figure 3C:
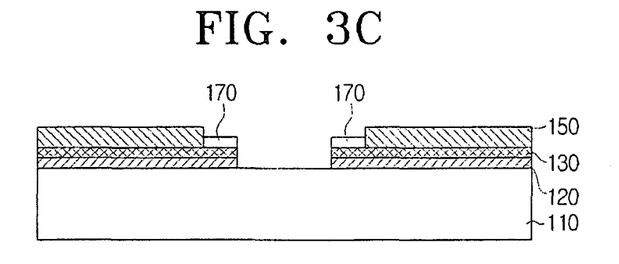

The silicon film 130 and the oxide layer 120 are removed from the area on which the extended electrode pattern 170 and the electrode pattern 150 are not formed as shown in FIG. 3C. The upper silicon film 130 may be, e.g., removed by performing reactive ion etching (RIE) on the substrate 100, and the oxide layer 120 may be, e.g., removed by performing wet etching.

Figure 3D:
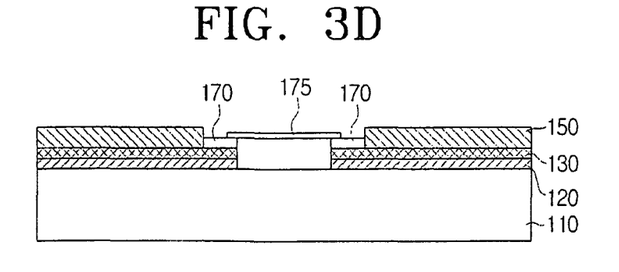

A first coating layer 175 connecting the extended electrode patterns 170 is formed as shown in FIG. 3D. In this case, the soft lithographic technique may be used. For example, the first coating material may be coated on the soft lithographic stamp, and the first coating material may be printed so as to be interposed between the extended electrode patterns 170.

The photo lithographic technique may also be used to form the first coating layer 175. The first coating material may be coated on the area on which the extended electrode patterns 170 are interposed using the photo mask and the photo resist. The first coating material may be a 3-aminopropylitriethoxysilane (3-APS) polymer material so as to enhance the performance of attaching the nano structure.

Figure 3E:
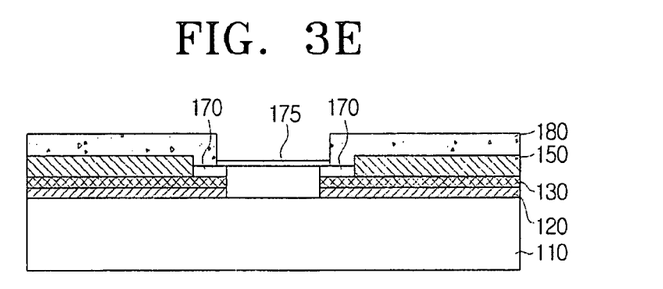

A second coating layer 180 is formed on an area excluding the first coating layer 175 as shown in FIG. 3E. The second coating layer 180 is formed using a second coating material which is not mixed with the first coating material. Specifically, the second coating material may be an octadecyltrichlorosilane (OTS) polymer material. Thus, the second coating layer 180 may be formed on an area excluding the first coating layer 175.

Figure 3F:
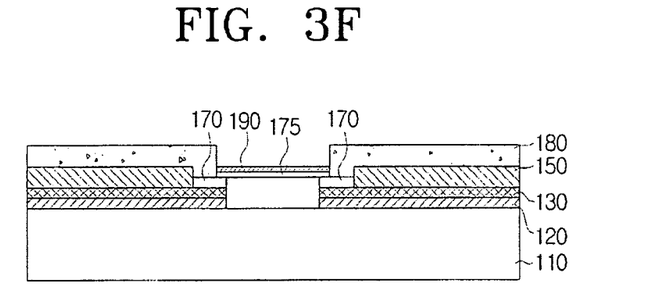

A nano material is deposited as shown in FIG. 3F. The nano material is deposited on the first and second coating layers 175 and 180. The nano material coated on the first coating layer 175 forms a nano structure 190.

Specifically, the nano structure 190 can be, for example, a carbon nano tube, an oxide nano wire, or a polymer nano fiber.

As described above, since the first coating layer 175 is a highly cementitious material and adheres well with the nano material, the nano structure 190 may be connected in a fixed manner between the extended electrode patterns 170.

Figure 3G:
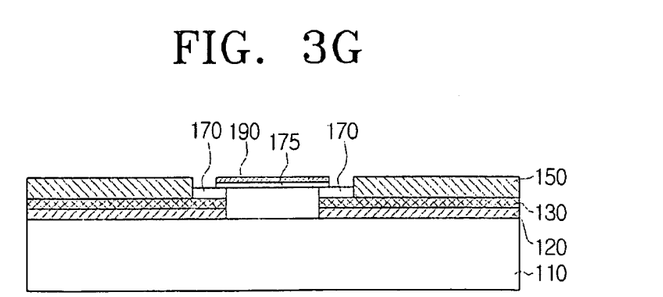

The second coating layer 180 is removed as shown in FIG. 3G. In this case, the nano material coated on the second coating layer 180 is also removed, and then, the first coating layer 175 not having the nano structure 190 is removed by dry etching. As a result, a resonator structure is fabricated as shown in FIG. 3G.

Even when a nano structure is fabricated in a bridge shape and operates at room temperature, a high Q value is acquired. As the Q value of a general silicon carbide (SiC) resonator is in inverse proportion to an increase in temperature, it is difficult to acquire a high Q value at room temperature. The resonators operate within the MHz band in order to maintain a high Q value. As described in an exemplary embodiment of the present invention, if a nano structure such as a carbon nano tube is used, the resonator may operate at a band of over 10 GHz even at room temperature.

FIGS. 4A to 4G are plan views corresponding to FIGS. 3A to 3G.

Figure 4A:
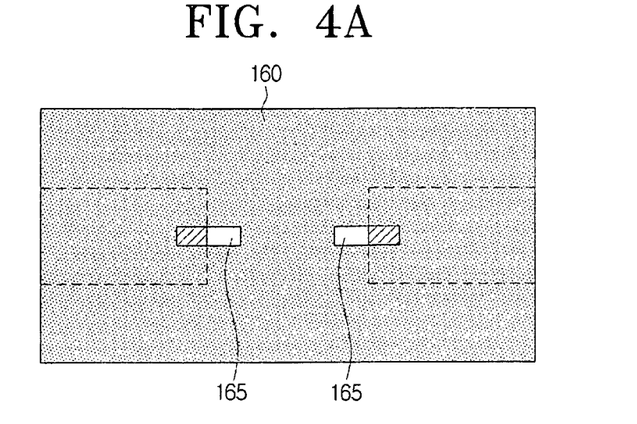
FIGS. 4A to 4G are plan views corresponding to FIGS. 3A to 3G.

Referring to FIG. 4A, part of the area 165 is removed while the resin layer 160 is coated on the whole surface of the substrate 100, and thus the silicon film 130 and the electrode pattern 150 are exposed.

Figure 4B:
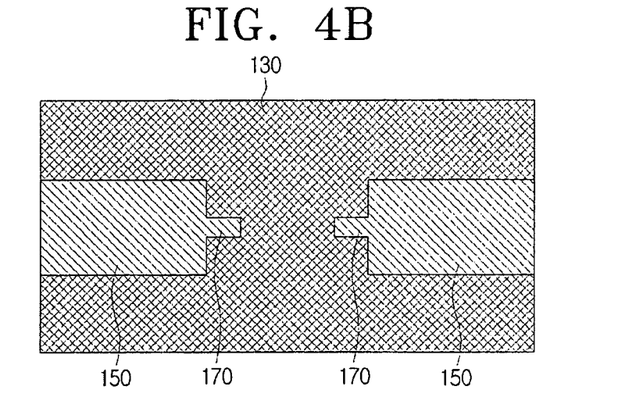

Referring to FIG. 4B, the resin layer 160 is removed after the whole surface is metallized, and the extended electrode pattern 170 connected to the electrode pattern 150 is formed. The width of the extended electrode pattern 170 may be less than that of the electrode pattern 150.

Figure 4C:
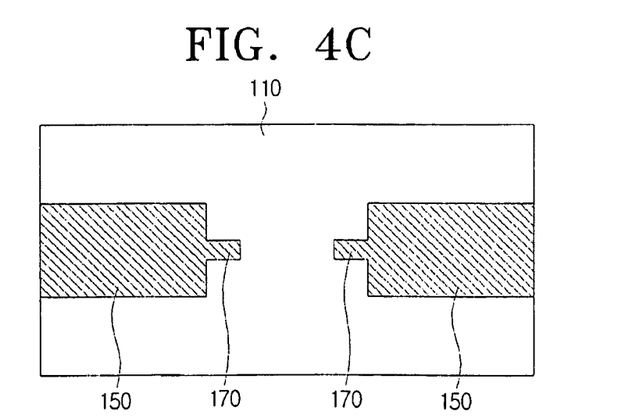

Referring to FIG. 4C, the silicon substrate 110 is exposed so that the silicon film 130 and the oxide layer 120 on the area excluding the extended electro pattern 170 and the electrode pattern 150 may be removed.

Figure 4D:
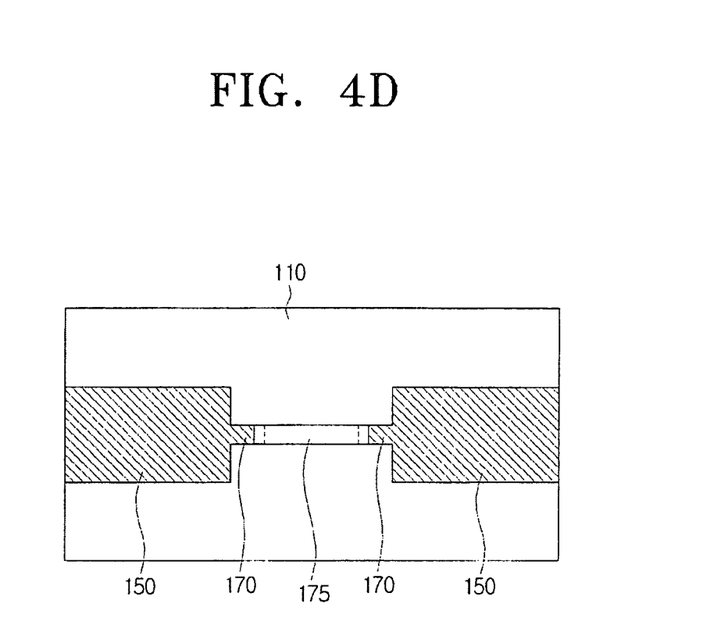

Referring to FIG. 4D, the first coating layer 175 is interposed between the extended electrode patterns 170.

Figure 4E:
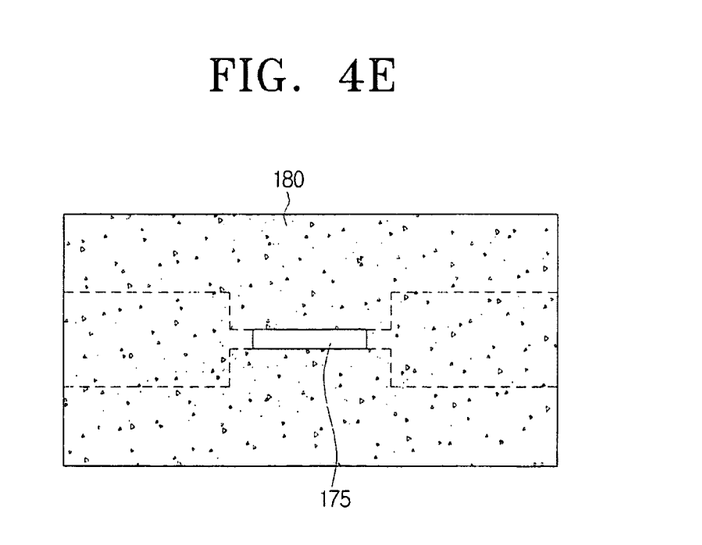

The second coating layer 180 is formed over the whole surface of the substrate 100 as shown in FIG. 4E. The second coating layer 180 is made of a material incompatible with the first coating layer 175, so that the second coating layer 180 is formed on an area excluding the first coating layer.

Figure 4F:
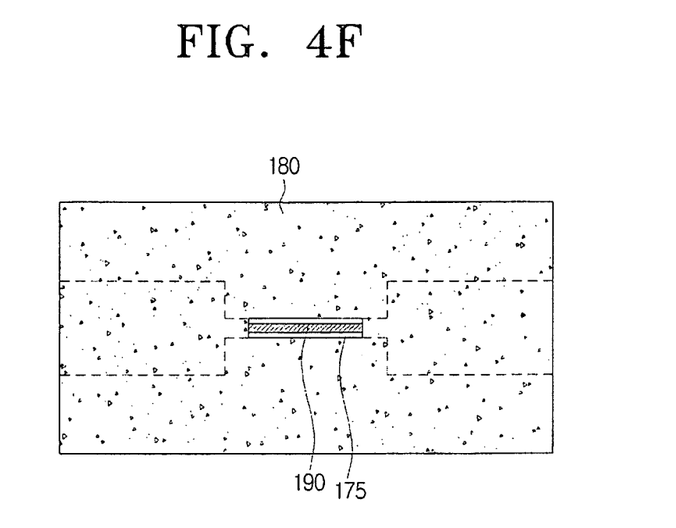

Referring to FIG. 4F, if nano materials are disposed, part of the nano materials are covered on the first coating layer 175, and thus the nano structure 190 is formed.

Figure 4G:
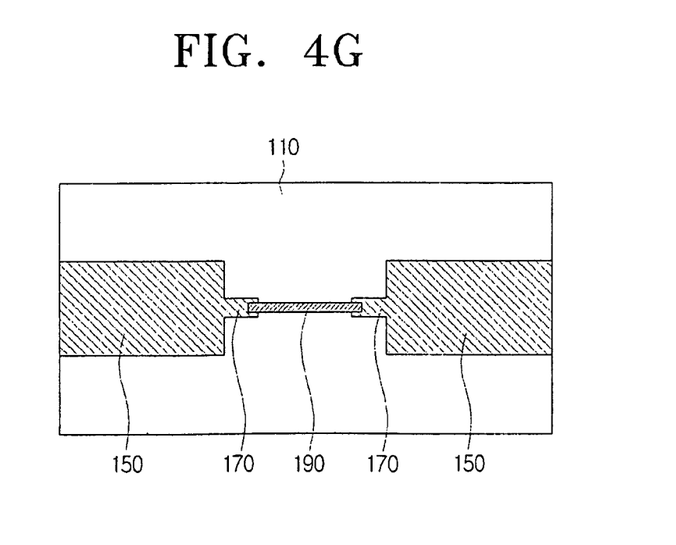

If the first and second coating layers 175 and 180 are removed, the nano materials coated on the second coating layer 180 are also removed. Accordingly, the nano resonator is fabricated as shown in FIG. 4G.

As described above, both micro processing and nano processing are used to fabricate the resonator, so the advantage of each may be maximized. Specifically, the resonant region is provided at a nanometer level, and the resonator is used within the GHz band, and the resonant region is also provided at a micrometer level. Therefore, the resonator is easily connected to an external electrode.

In the resonator fabrication method according to an exemplary embodiment of the present invention, high-cost nano processing is applied to part of the substrate. Therefore, economic efficiency is enhanced.

Figure 5:
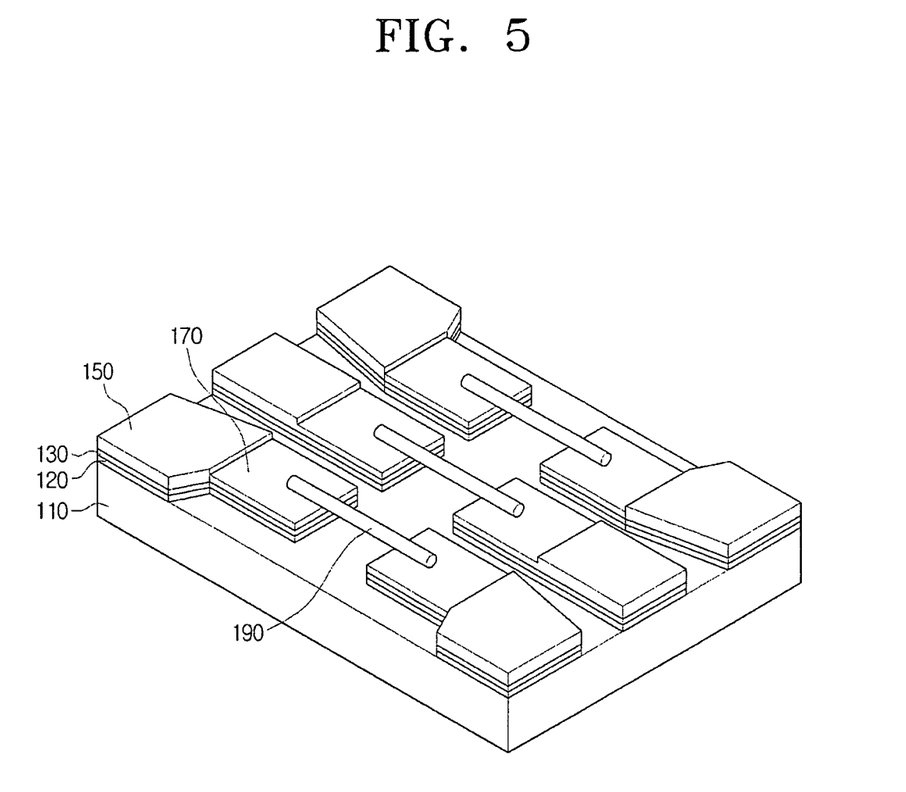
FIG. 5 is a schematic view illustrating the structure of a resonator fabricated according to an exemplary embodiment of the present invention.

FIG. 5 is a schematic view illustrating the structure of a resonator fabricated according to an exemplary embodiment of the present invention. Referring to FIG. 5, while three resonators are provided, the number of resonators may be adjusted according to the fabricator's intended application.

The respective nano resonators may include the electrode patterns 150, the extended electrode patterns 170, and the nano structure 190 interposed between the extended electrode patterns 170. In FIG. 5, the resonator placed at the center of the silicon substrate 110 includes the electrode pattern 150 and the extended electrode pattern 170 of the same width, whereas the width of the extended electrode pattern 170 may be narrower than that of the electrode pattern 150 as shown in FIG. 4G.

The resonators placed on both sides include the electrode patterns 150 formed in a different shape from that of the resonator placed at the center. The electrode pattern 150 may be formed in various shapes to be easily connected to external electrode circuits.

The first coating layer 175 positioned between the nano structure 190 and the extended electrode pattern 170 may be made of aminopropylitriethoxysilane (APS) polymer material which adheres well to the nano structure 190 as described above. There is an opportunity to improve adhesion between the nano structure 190 and the extended electrode pattern 170.

Figure 6A:
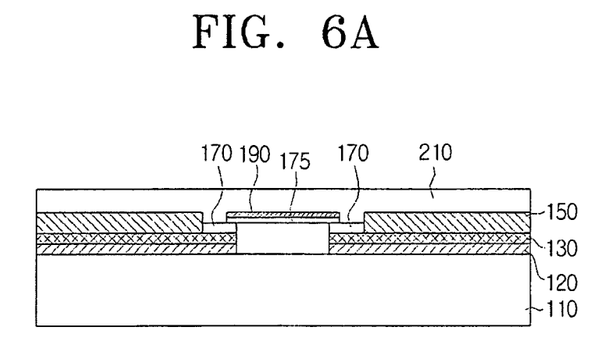
FIGS. 6A to 6C are sectional views illustrating the process of forming a fixed electrode in a resonator fabrication method according to an exemplary embodiment of the present invention.

According to an exemplary embodiment of the present invention, a resin layer 210 is additionally coated over the whole surface of the resonator as shown in FIG. 6A.

Figure 6B:
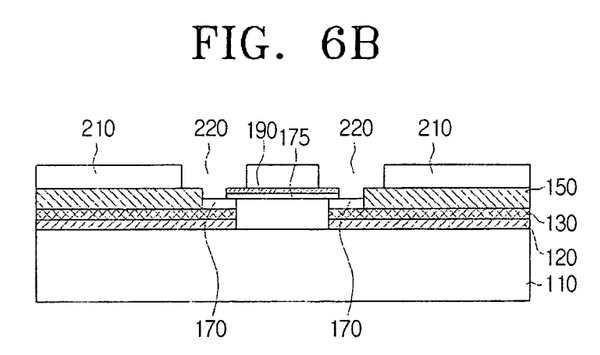

Part of the resin layer 210 is removed so that the extended electrode pattern 170 connected to the nano structure 190 is exposed as shown in FIG. 6B. Part of the electrode pattern 150, part of the extended electrode pattern 170, and part of the nano structure 190 are exposed on the area 220 from which the resin layer is removed. The resin layer 210 may be removed using the nano-imprint technique.

Figure 6C:
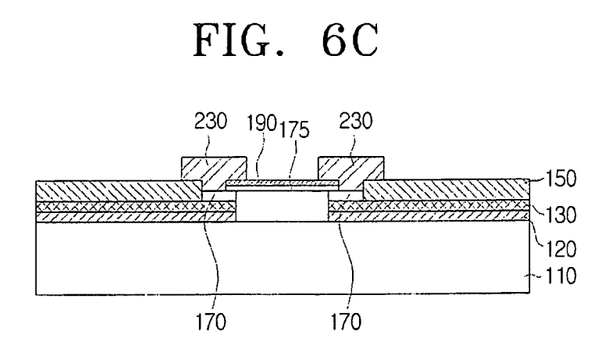

The resin layer 210 is removed after the whole surface, is furnished with metal, so the metal remains on the area 220 from which the resin layer 210 has been removed. The metal remaining on the area 220 from which the resin layer 210 has been is used as a fixed electrode 230 to fix the nano structure to the extended electrode pattern 170. As a result, the fixed electrode 230 causes the nano structure to be stably fixed to the extended electrode pattern 170.

Figure 7A:
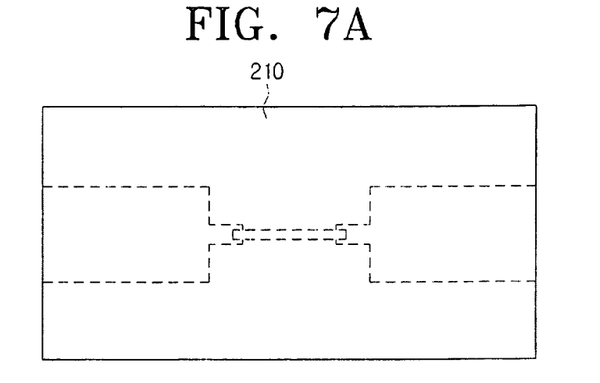
FIGS. 7A to 7C are plan views corresponding to FIGS. 6A to 6C.
Figure 7B:
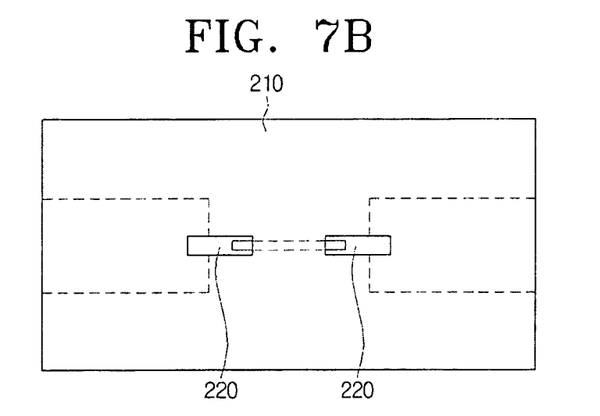
Figure 7C:
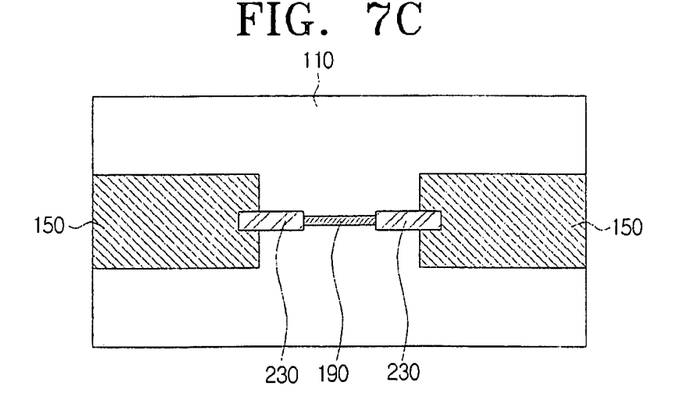

FIGS. 7A to 7C are plan views corresponding to FIGS. 6A to 6C.

The resin layer 210 is coated over the whole surface as shown in FIGS. 6A and 7A, and part of the resin layer 210 is removed as shown in FIGS. 6B and 7B. The width of the area 220 from which the resin layer 210 has been removed may be identical to that of the extended electrode pattern 170. The whole surface is covered with metal, and the resin layer 210 is removed. Thus, the fixed electrode 230 is formed.

The resonator including the fixed electrode 230 may be fabricated as shown in FIGS. 6C and 7C.

Figure 8A:
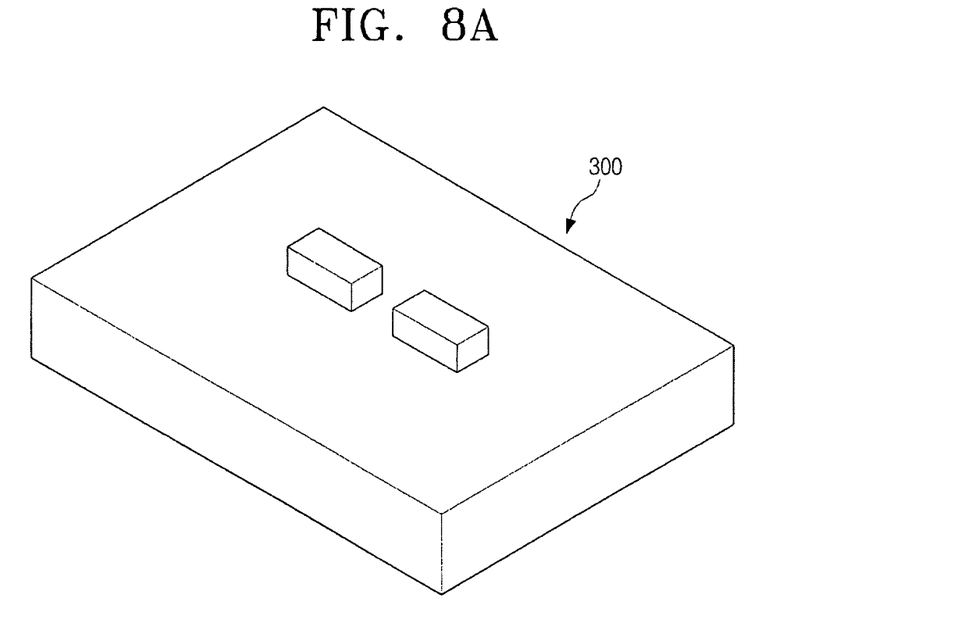
FIGS. 8A and 8B are schematic views illustrating a nano-imprint stamp and a soft lithographic stamp.

FIG. 8A is a schematic view illustrating a nano-imprint stamp used when fabricating a resonator according to various exemplary embodiments of the present invention. If a nano-imprint stamp 300 having uniform size is used, the nanoimprint stamp 300 is easily arranged on the substrate 100. The position of the extended electrode pattern 170 may be precisely adjusted at the nano level.

Figure 8B:
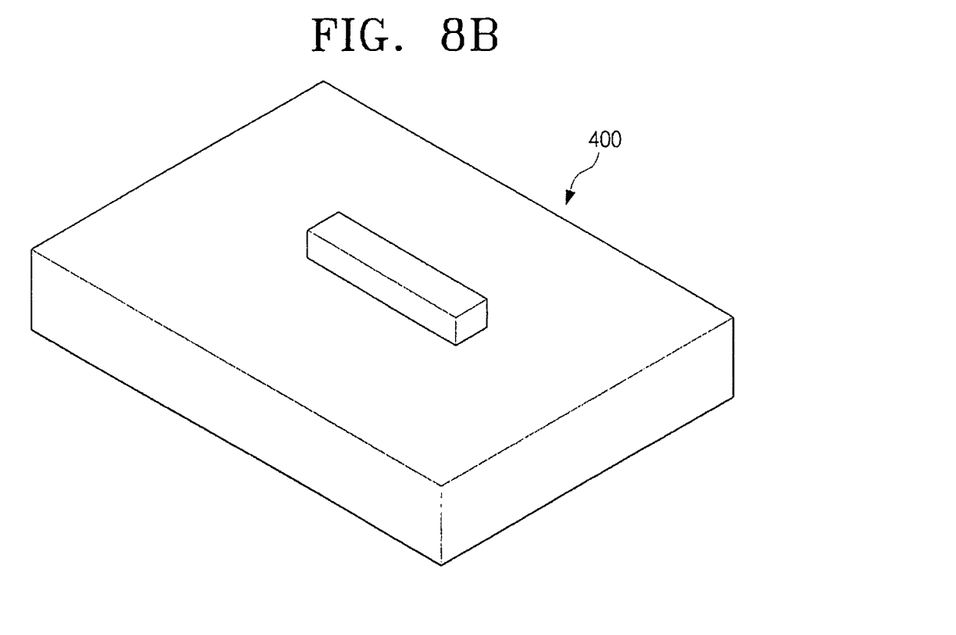

FIG. 8B is a schematic view illustrating a soft lithographic stamp 400 used when forming the first coating layer 175. The length of the stamping area of the soft lithographic stamp 400 may be longer than the interval between the extended electrode patterns 170. Accordingly, the first coating layer 175 may be interposed between the extended electrode patterns 170 by stamping the soft lithographic stamp 400.

As described above, the nano structure 190 can be, for example, a carbon nano tube, an oxide nano wire, or a polymer nano fiber.

The foregoing exemplary embodiments and advantages are merely exemplary and are not to be construed as limiting the present invention. The present teaching can be readily applied to other types of apparatuses. Also, the description of the exemplary embodiments of the present invention is intended to be illustrative, and not to limit the scope of the claims, and many alternatives, modifications, and variations will be apparent to those skilled in the art.

What is claimed is:

1. A resonator fabrication method, comprising:
    forming a plurality of electrode patterns that are disposed apart from each other on a first exposed area of a uniformly flat surface of a substrate;
    forming an extended electrode pattern that is connected to the plurality of electrode patterns and that is formed on a second exposed area of the uniformly flat surface of the substrate that is located between the plurality of electrode patterns; and
    forming a nano structure that is laid on top of a portion of the extended electrode pattern.

2. The method of claim 1, wherein the forming of the plurality of electrode patterns comprises:
    forming the plurality of electrode patterns disposed apart from each other by forming a photo resist pattern on a surface of the substrate, covering the surface with metal, and removing the photo resist pattern from the surface;
    coating a resin layer on the electrode pattern; and
    performing a nano-imprint using a prepared nano-imprint stamp on the substrate to remove at least one part of the resin layer.

3. The method of claim 2, wherein the forming the extended electrode pattern comprises:
    forming the plurality of extended electrode patterns connected to the plurality of electrode patterns by exposing the substrate by removing a part of the resin layer, and metallizing the exposed substrate;
    forming a first coating layer connecting the plurality of extended electrode patterns;
    forming a second coating layer over the whole area excluding the first coating layer; and
    forming the nano structure laid across the extended electrode patterns by depositing a nano material on the first coating layer and the second coating layer, and removing the second coating layer and the nano material on the second coating layer.

4. The method of claim 3, wherein forming the first coating layer comprises using a photolithographic technique or a soft lithographic technique.

5. The method of claim 3, wherein the first coating layer is made of a 3-aminopropylitriethoxysilane (3-APS) polymer material, and the second coating layer is made of an octadecyltrichlorosilane (OTS) polymer material.

6. The method of claim 1, wherein the forming of the plurality of electrode patterns proceeds at a micrometer level, and the forming the extended electrode pattern proceeds at a nanometer level.

7. The method of claim 1, wherein the plurality of electrode patterns are formed at a micrometer level, and the plurality of extended electrode patterns are formed at a nanometer level.

8. The method of claim 1, wherein the nano structure comprises one of a carbon nano tube, an oxide nano wire, and a polymer nano fiber.

9. The method of claim 1, further comprising:
    fixing the nano structure on the plurality of extended electrode patterns.

10. The method of claim 9, wherein the fixing comprises:
    additionally coating a resin layer;
    removing a part of the additionally coated resin layer using the nano-imprint technique; and
    additionally forming a fixed electrode to fix the nano structure to the plurality of extended electrode patterns by metallizing the part from which the additionally coated resin layer is removed, and removing the remainder of the additionally coated resin layer.

11. The method of claim 1, wherein, prior to forming the nano structure, the method further comprises forming a first coating layer connecting the plurality of extended electrode patterns, and forming the nano structure on top of the first coating layer.

12. The method of claim 11, wherein the first coating layer is formed by using a photolithographic technique or a soft lithographic technique.

13. The method of claim 11, wherein the first coating layer comprises a 3-aminopropylitriethoxysilane (3-APS) polymer material.

14. The method of claim 1, wherein the substrate is formed by sequentially laying a silicon substrate, an oxide layer, and a silicon film, and the method further comprises removing a portion of the oxide layer and the silicon film between the plurality of electrode patterns.

* * * * *